United States Patent [19]

Pedone

[11] Patent Number: 4,678,933
[45] Date of Patent: Jul. 7, 1987

[54] SOLID STATE RELAY FOR AEROSPACE APPLICATIONS

[75] Inventor: Alessandro Pedone, L'Aquila, Italy

[73] Assignee: Selenia Spazio SpA, L'Aquila, Italy

[21] Appl. No.: 692,037

[22] Filed: Jan. 16, 1985

[30] Foreign Application Priority Data

Jan. 23, 1984 [IT] Italy ............................. 35532/84[U]

[51] Int. Cl.[4] ........................ H03K 17/60; H03K 3/45
[52] U.S. Cl. .................................... 307/254; 307/255; 307/314
[58] Field of Search ............... 307/239, 282, 281, 253, 307/255, 314, 352, 252 C, 252 N; 323/339

[56] References Cited

U.S. PATENT DOCUMENTS

| 3,025,418 | 3/1962 | Brahm | 307/255 |
| 3,089,961 | 5/1963 | Overn et al. | 307/281 |
| 3,182,249 | 5/1965 | Pahlavan | 307/314 X |
| 3,914,626 | 10/1975 | Peterson | 307/352 |

Primary Examiner—Stanley D. Miller
Assistant Examiner—B. P. Davis
Attorney, Agent, or Firm—Karl F. Ross; Herbert Dubno

[57] ABSTRACT

A solid state relay for aerospace applications utilize a transistor circuit for selectively short-circuiting and open-circuiting a secondary winding of a current transformer whose primary winding is in series with an alternating current source and an alternating current load.

6 Claims, 2 Drawing Figures

SOLID STATE RELAY FOR AEROSPACE APPLICATIONS

FIELD OF THE INVENTION

My present invention relates to a solid state relay for aerospace applications and, more particularly, to a solid state relay for controlling the ON and OFF conditions for a load connected to alternating current sources in avionic and space applications.

BACKGROUND OF THE INVENTION

It is known in aerospace applications and elsewhere to provide a relay for controlling the ON and OFF states of a load connected to an alternating current supply with a relay, such relays being advantageous whenever the control command is at a low level and the level of electric current which should be controlled is significant and/or the load circuit must be isolated from the command circuit.

At the present time alternating current loads can be connected to or disconnected from a source of alternating current by either an electromagnetic relay, i.e. a relay having moving parts, or a static relay which is generally of solid-state construction and can be devoid of any moving parts.

Aerospace applications put control devices for such purposes to rigorous test, because the environment in which the control circuit must operate is one of mechanical shock represented by the high-energy forces of launching and acceleration or from collision, the stresses resulting from particle bombardment, and thermal extremes.

Whether these relays are of a mechanical or moving-part type or static type having no moving parts, they generally are designed to be bistable, i.e. to latch the load circuit in an operative condition upon receipt of an ON command and in turn deenergize the load upon receipt of an OFF command.

The mechanical relay can comprise a latching relay having two coils, one of which is energized to place the relay in the ON state and the other of which can be energized to place the relay in the OFF state. The latching relay, therefore, is either on or off, depending upon which of the two coils is energized, and retains one of the two stable configurations until a configuration-change command arises at the other coil.

The latching relay systems currently in use for aerospace applications have both electrical and mechanical drawbacks.

Among the mechanical drawbacks are the delicacy of the latching relay mechanism which limits the acceleration to which the relay can be subjected and thus the application of the relay, high tendency to contact wear limiting the operational life in terms of the number of useful operations, and fragile internal structure which can be damaged beyond repair by mechanical shock.

The electrical drawbacks include the reliance for the electrical connection upon mechanical pressure provided by a spring urging the two contacts together, significant contact resistance differences from one unit to another and from time to time during use of each unit, thereby effecting detrimentally the reliability and reproducibility of the results. Furthermore, because of arcing phenomena, mostly with contact opening, contact surface deterioration occurs and radio frequency disturbances are created.

Latching relays have other disadvantages as well. For example, the time required for complete opening or closing is generally of the order of tens of milliseconds, thereby requiring command pulses longer than the minimum opening or closing durations to ensure complete execution of the command. When the relay is exposed to the command for periods on the order of milliseconds but less than the minimum required, a bounce effect may result with repeated openings and closings of the contacts.

It has thus been recognized that mechanical relays in many cases are not able to satisfy the desiderata of aerospace applications which require the relay to resist and tolerate the high vibrations and accelerations during a launching phase and the intensive particle bombardment of an orbit phase. Consequently, reliance has been placed largely upon static relays.

A static relay for control of alternating current generally comprises a triac or controlled rectifier which acts as a solid state static circuit-opening or circuit-closing element in the alternating current circuit.

The triac is, in turn, driven by a photo coupler which receives the external commands and provides the longer pulses required, while affording galvanic isolation of the command circuit from the alternating current load circuit.

Such prior art solid state relays also have been found to be inadequate for modern aerospace applications. For one thing, such solid state circuits use components, like photocouplers, which suffer an aging phenomenon accelerated by high doese of space radiation.

Furthermore, triacs are not generally among the components listed as acceptable for space applications under most standards because of poor reliability.

OBJECTS OF THE INVENTION

It is the principal object of my present invention to provide a high-reliability solid state relay of an alternating current load circuit, especially in aerospace applications, whereby the disadvantages of the aforedescribed mechanical and solid state relays can be obviated.

Another object of this invention is to provide a solid state relay for the purposes described which has improved reliability even under strenuous conditions prevalent in space and which can withstand shock and aging-acceleration conditions with a minimum of difficulty.

Still another object of the instant invention is to provide a relay which is composed of electronic components readily available on the standard space applications listed, which affords a shorter response time and which renders the switching of an alternating current also more efficient than has been the case heretofore.

SUMMARY OF THE INVENTION

These objects and others which will become apparent hereinafter are attained, in accordance with the present invention, in a solid state relay for alternating current applications, especially for aerospace use, i.e. on rockets, space stations and satellites, which comprises a current transformer having a primary winding connected in series with the alternating current source and the load, and a tapped secondary winding whose winding halves can be selectively short-circuited by semiconductor devices in the form of transistor switches receiving the ON command and the OFF command, respectively.

Surprisingly, the relatively simple circuit of the invention possesses all of the advantages enumerated above while obviating the problems described.

BRIEF DESCRIPTION OF THE DRAWING

The above and other objects, features and advantages of the present invention will become more readily apparent from the following description, reference being made to the accompanying drawing, in which.

SPECIFIC DESCRIPTION

Figure 1:
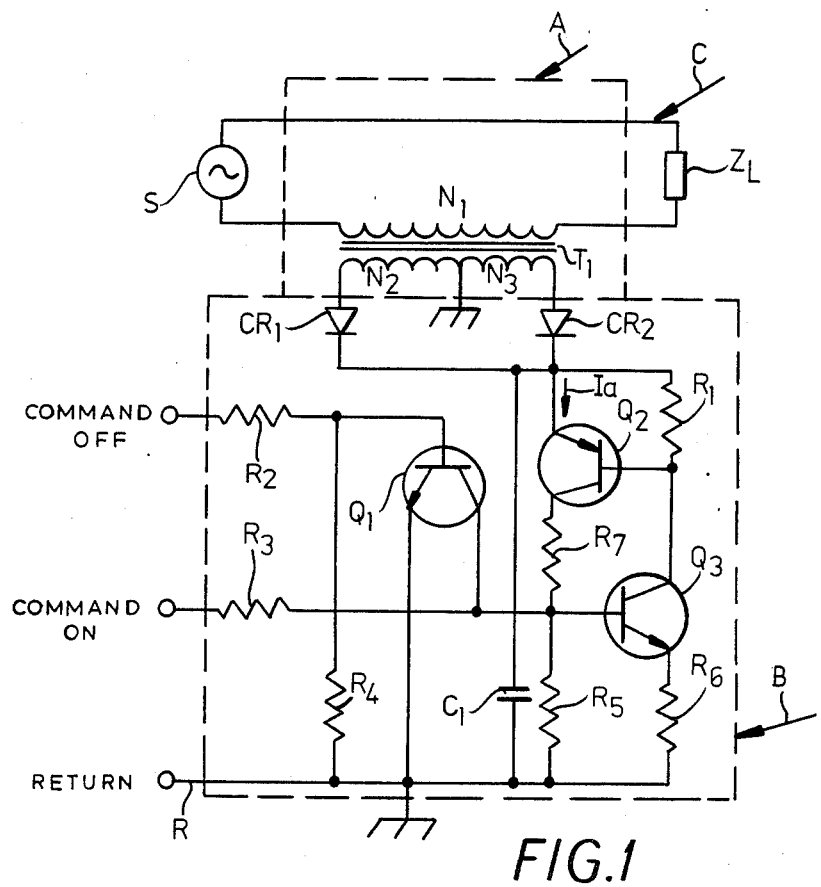
FIG. 1 is a circuit diagram illustrating the invention.

From the drawing it will be apparent that an alternating current circuit can include an alternating current source 5 connected across a load $Z_L$ and controlled by the solid state relay contained in a potted structure B connected with a potted current transformer A, both of which are capable of withstanding substantial mechanical impact and acceleration forces and which are also not readily prone to aging or to damage by high energy particle fluxes.

The circuitry shown in the drawing also is able to maintain isolation between the alternating current circuit represented generally at C and the control circuit.

This isolation is ensured by a current transformer $T_1$ whose primary winding $N_1$ is connected in series between the source S and the load ZL, this primary winding being traversed by the load current.

The secondary winding is center-tapped to form two coils $N_2$ and $N_3$ which are short-circuited through a pair of transistors $Q_2$ and $Q_3$ through a resistor $R_1$ via diodes $CR_1$ and $CR_2$.

More particularly, the diodes $CR_1$ and $CR_2$ are connected between the terminals of the coils $N_2$ and $N_3$ to the emitter of the transistor $Q_2$ whose collector lies in series with resistors $R_7$ and $R_5$ connected to the return bus R. The transistor $Q_3$ has its emitter-collector circuit tied to the base of the transistor $Q_2$, resistors $R_1$ and $R_6$ forming the emitter-base bias resistor for the two transistors.

The OFF command is applied via a resistor $R_2$ to the base of the transistor $Q_1$ whose emitter-collector circuit is bridged between the base and the return bus of transistor $Q_3$ while the ON command is applied through the resistor $R_3$ directly to the base of the transistor $Q_3$ which is latched in its conductive state until the OFF command is applied to the transistor $Q_1$.

In the nonconductive phase of the transistor $Q_3$, transistor $Q_2$ remains conductive to maintain a short-circuit condition in the secondary coils $N_2$, $N_3$.

Consequently, when the transistor $Q_2$ and $Q_3$ keep the tapped winding short-circuited, the primary winding assumes a very low impedance reflected by the impedance in the secondary winding and therefore as as a closed circuit to render the alternating current circuit C conductive and placing the load in its ON condition.

When the short circuit or the secondary winding is removed by the OFF command, primary winding $N_1$ assumes a high impedance value, say, 5 k ohm and therefore impedes current flow.

Figure 2:
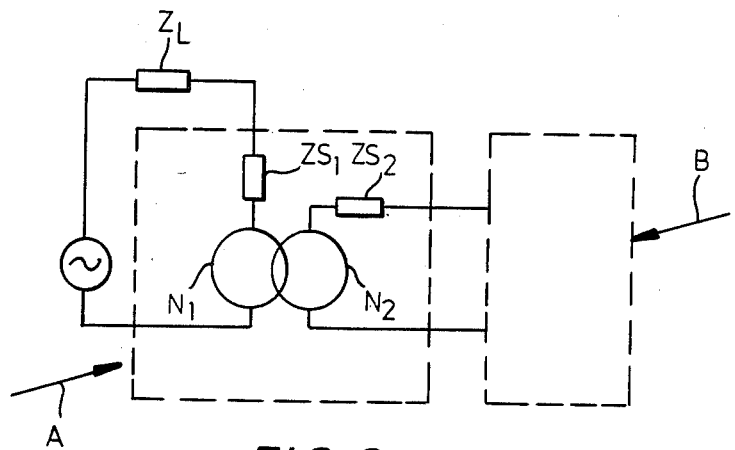
FIG. 2 is a diagram of the equivalent circuit thereof.

In practice, the circuit shown in FIGS. 1 and 2 can manage a 15 Watt load if the generator S provides 25 Veff sine or square wave. Since the transformer ratio is 1:2, the secondary current will be 300 mA.

For the relay of the invention to be effective, it must provide a very high series impedance $Z_S$ to the load. In practice this must be at least 100 times greater than the load impedance (FIG. 2) so that $Z_S$ must be greater than or equal to 100 $Z_L$.

In a preferred example of the invention, where the load is 15 W, $Z_L=41.5$ ohms and assuming a 20 kHz source, $Z_S=4.15$ k ohm which corresponds to a primary inductance of 33 mH.

Using a transformer $T_1$ of the ultraperm 10 Vacuumschmelze GMBH of the toroidal armature type of the following dimensions: Outer diameter=16 mm, internal diameter=12.5 mm, a height=8 mm, a winding constant $A_L$ of 37.5 micro H per turn can be derived from the data provided by the supply. To obtain the desired value of the inductance of 33 mH, 30 primary turns are required calculated in accordance with the relationship:

$$\frac{33}{0.0375} = \frac{K \cdot N_1}{K \cdot 1}, N = \sqrt{\frac{33}{0.0375}} = 30$$

The number of the secondary turns $N_2$ must be 60 for the transformation ratio of 1:2.

The detailed operation of the circuit is as follows:

When the base of transistor $Q_1$ receives a current which is equal to one tenth of its collector current the transistor conducts pushing its controller voltage to 0.

The collector of transistor $Q_3$ draws a current equal to the load current through the emitter-base junction of the transistor $Q_2$ to provide a proportional current in the emitter collector network of transistor $Q_2$.

This collector current of transistor $Q_2$ provides the driving signal to the transistor $Q_3$ even when the external command is removed.

Consequently, when an appropriate current pulse is applied to the transistor $Q_3$ base, i.e. the ON command transistor $Q_2$ and $Q_3$ are triggered so that all of the load current passes through the primary winding $N_1$ without impediment.

When the OFF command is applied in the form of a current equal to one tenth of the load current Ia, the resistor $Q_1$ draws off the base current and, since the transistor $Q_2$ can no longer supply current to the base of the transistor $Q_3$, the electronic switch opens. The potential at the transistor $Q_3$ increases and terminates the flow of current into the base of transistor $Q_2$.

In this manner, even when the transistor $Q_1$ is no longer driven by the OFF command, conductions of the transistors $Q_2$ and $Q_3$ are indicted and placed in their normally OFF quiescent state.

I claim:

1. A solid state relay for controlling an alternating current circuit having an alternating current source and an alternating current load, said solid state relay comprising:

a current transformer having
 a primary winding connected in series with said source and said load, and
 a secondary winding having a center-tap at ground potential and a pair of terminals;
 a pair of diodes each having two sides, one side of each diode being connected to a respective one of said terminals;
 a first transistor circuit having a first transistor with a base, an emitter and a collector, the other sides of said diodes being connected to said emitter of said first transistor;

a second transistor circuit having a second transistor with an emitter and a collector forming an emitter/collector path of said second transistor circuit, and further having a base, the base of said first transistor being connected to said emitter/collector path of said second transistor circuit;

a third transistor circuit having a third transistor with an emitter and a collector forming an emitter/collector path of said third transistor circuit, and further having a base, said base of said second transistor being connected to the emitter/collector path of said third transistor circuit;

resistive means connected to the collector of said first transistor and to the base of said second transistor;

means for applying an ON command to said base of said second transistor so as to short-circuit said secondary winding to render said primary winding conductive to alternating current; and means for applying an OFF command to said base of said third transistor so as to open-circuit said secondary winding for blocking alternating current flow through said primary winding.

2. A solid state relay for controlling an alternating current circuit having an alternating current source and an alternating current load, said solid state relay comprising:

a current transformer having
a primary winding connected in series with said source and said load, and
a secondary winding having a center-tap at ground potential and a pair of terminals;

a pair of diodes each having two sides, one side of each diode being connected to a respective one of said terminals;

a first transistor circuit having a first transistor with a base, an emitter and a collector, the other sides of said diodes being connected to said emitter of said first transistor;

a second transistor circuit having a second transistor with an emitter and a collector forming an emitter/collector path of said second transistor circuit, and further having a base, the base of said first transistor being connected to said emitter/collector path of said second transistor circuit;

a third transistor circuit having a third transistor with an emitter and a collector forming an emitter/collector path of said third transistor circuit, and further having a base, said base of said second transistor being connected to the emitter/collector path of said third transistor circuit;

resistive means connected to the collector of said first transistor and to the base of said second transistor;

means for applying an ON command to said base of said second transistor so as to short-circuit said secondary winding to render said primary winding conductive to alternating current;

means for applying an OFF command to said base of said third transistor so as to open-circuit said secondary winding for blocking alternating current flow through said primary winding; and current return bus means coupled to said center-tap at ground potential of said secondary winding and to said emitter/collector path of said third transistor circuit.

3. The solid state relay defined in claim 2, further comprising a condenser connected between said emitter of said first transistor and said bus.

4. The solid state relay defined in claim 3, further comprising a bias resistor connected between the emitter and base of said first transistor, a further resistor being connected between the emitter of said first transistor and the base of said second transistor, additional resistors being connected respectively between the base of said second transistor and the emitter of said second transistor and said bus and between the base of said third transistor and said bus.

5. The solid state relay defined in claim 4 wherein means for applying said OFF command includes a series resistor and the means for applying said ON command includes a series resistor.

6. The solid state relay defined in claim 5 wherein said transistor circuits are potted.

* * * * *